United States Patent
Schenk et al.

(10) Patent No.: US 10,008,486 B2
(45) Date of Patent: Jun. 26, 2018

(54) DISC-SHAPED THYRISTOR FOR A PLURALITY OF PLATED-THROUGH SEMICONDUCTOR COMPONENTS

(71) Applicants: INFINEON TECHNOLOGIES BIPOLAR GMBH & CO. KG, Warstein (DE); SIEMENS AKTIENGESELLSCHAFT, Munich (DE)

(72) Inventors: Mario Schenk, Warstein (DE); Jens Przybilla, Warstein (DE); Reiner Barthelmess, Soest (DE); Joerg Dorn, Buttenheim (DE)

(73) Assignees: INFINEON TECHNOLOGIES BIPOLAR GMBH & CO. KG, Warstein (DE); SIEMENS AKTIENGESELLSCHAFT, Munich (DE)

( * ) Notice: Subject to any disclaimer, the term of this patent is extended or adjusted under 35 U.S.C. 154(b) by 5 days.

(21) Appl. No.: 15/121,773

(22) PCT Filed: Feb. 17, 2015

(86) PCT No.: PCT/EP2015/053289
§ 371 (c)(1),
(2) Date: Aug. 26, 2016

(87) PCT Pub. No.: WO2015/128220
PCT Pub. Date: Sep. 3, 2015

(65) Prior Publication Data
US 2017/0033091 A1  Feb. 2, 2017

(30) Foreign Application Priority Data
Feb. 26, 2014 (DE) .................. 10 2014 102 493

(51) Int. Cl.
H01L 23/34 (2006.01)
H01L 25/11 (2006.01)
(Continued)

(52) U.S. Cl.
CPC .......... *H01L 25/115* (2013.01); *H01L 23/051* (2013.01); *H01L 23/32* (2013.01);
(Continued)

(58) Field of Classification Search
CPC ..... H01L 25/115; H01L 23/051; H01L 24/72; H01L 23/473; H01L 2924/1301;
(Continued)

(56) References Cited

U.S. PATENT DOCUMENTS 3,719,862 A    3/1973  Gaicki
5,866,944 A *  2/1999  Hiyoshi .............. H01L 23/051
                                                    257/178
(Continued)

FOREIGN PATENT DOCUMENTS

DE  32 23 532 A1  12/1983
EP  0 962 973 A1  12/1999
EP  2 211 384 A2   7/2010

*Primary Examiner* — Shouxiang Hu
(74) *Attorney, Agent, or Firm* — Norman B. Thot

(57) ABSTRACT

A disk cell for pressure contacting a plurality of semiconductor components via a clamping device to generate a clamping force. The disk cell includes a housing comprising at least one metallic pressure plate, a first semiconductor component arranged in the housing, and a second semiconductor component arranged in the housing. The first and second semiconductor components are different. The at least one metallic pressure plate reaches across and clamps the first and second semiconductor components, is substantially perpendicular to the clamping force, and is arranged so that the clamping force acts on the at least one metallic pressure plate to provide a local region of influence to clamp the first and second semiconductor components. The first semicon-
(Continued)

ductor component is arranged below the local region of influence of the clamping force. The second semiconductor component is at least partially arranged outside the local region of influence of the clamping force.

18 Claims, 3 Drawing Sheets

(51) Int. Cl.
      *H01L 25/07*     (2006.01)
      *H01L 23/40*     (2006.01)
      *H01L 23/32*     (2006.01)
      *H01L 23/367*    (2006.01)
      *H01L 23/473*    (2006.01)
      *H01L 23/00*     (2006.01)
      *H01L 23/051*    (2006.01)

(52) U.S. Cl.
      CPC ...... *H01L 23/3675* (2013.01); *H01L 23/4006* (2013.01); *H01L 23/473* (2013.01); *H01L 24/72* (2013.01); *H01L 25/072* (2013.01); *H01L 2924/1203* (2013.01); *H01L 2924/1301* (2013.01); *H01L 2924/13055* (2013.01)

(58) Field of Classification Search
      CPC ... H01L 2924/1203; H01L 2924/13055; H01L 25/072; H01L 23/4006; H01L 23/32; H01L 23/3675
      USPC .......................... 257/718, 726, 727, 719, 785
      See application file for complete search history.

(56) References Cited

U.S. PATENT DOCUMENTS

| | | | |
|---|---|---|---|
| 6,181,007 B1 | 1/2001 | Yamazaki et al. | |
| 6,297,549 B1 * | 10/2001 | Hiyoshi | H01L 25/072 |
| | | | 257/502 |
| 6,495,924 B2 * | 12/2002 | Kodama | H01L 24/72 |
| | | | 257/178 |
| 2007/0266558 A1 * | 11/2007 | Otremba | H01L 23/492 |
| | | | 29/840 |

* cited by examiner

US 10,008,486 B2

DISC-SHAPED THYRISTOR FOR A PLURALITY OF PLATED-THROUGH SEMICONDUCTOR COMPONENTS

CROSS REFERENCE TO PRIOR APPLICATIONS

This application is a U.S. National Phase application under 35 U.S.C. § 371 of International Application No. PCT/EP2015/053289, filed on Feb. 17, 2015 and which claims benefit to German Patent Application No. 10 2014 102 493.1, filed on Feb. 26, 2014. The International Application was published in German on Sep. 3, 2015 as WO 2015/128220 A1 under PCT Article 21(2).

FIELD

The present invention relates to a disk cell for several semiconductor components, in particular for several power semiconductor components.

BACKGROUND

Disk cells generally serve for accommodating and electrically contacting at least one semiconductor component and are usually in a heat-conducting contact with a heat sink. The main purpose of the disk cell is to hermetically seal the semiconductor component while at the same time connecting it electrically and thermally by pressure contacting the semiconductor component from the outside. Known disk cells substantially include a housing and at least one semiconductor component. In this case, the disk cell constitutes a tradeable unit. Disk cells are also known in which several semiconductor components are accommodated that are of the same type with respect to their geometrical dimensions. This is not problematic to the extent that, given a matching type, the components are identical with respect to their mechanical load limits. Clamping several components becomes problematic if they have different mechanical load-bearing capacities already due to different geometries. While merely equipping the housing interior with the semiconductor components generally does not present any problems, the mechanically weakest component may easily be damaged during clamping if the disk cell is clamped, usually at the end consumer, for electrical and thermal contacting. Due to the different load limits, the semiconductor components of various types previously had to be clamped in separate disk cells in order to adjust the clamping action separately for each component so as to be able, in the end, to allow for the different mechanical load limits of the components. This is disadvantageous in that the number of parts is increased, the structural volume of the disk cell becomes disadvantageously large, and the design and/or the possibly required specific adjustment of the clamping action is comparatively complex.

To this end, generic assemblies comprising the disk cell have clamping devices, such as tension or compression screwing mechanisms, which serve to fix the semiconductor components and to electrically and thermally pressure-contact the plurality of the semiconductor components. In view of the problems in the case of thermal alternating loads arising particularly in power semiconductor electronics, such pressure contacts were developed for contacting high-voltage resistant and high-current resistant components. Examples for such high-voltage resistant semiconductor components include high-voltage thyristors, the central components in high-power converters. High standards with respect to component reliability apply particularly for such systems. Since the components have comparatively brittle layers consisting of semiconductor materials, the components are always in jeopardy of being destroyed in the case of mechanical overloading by pressure contacting.

Establishing and maintaining a mechanical and thus an electrical and a thermal contact between a contact region of an electronic component and a current-carrying contact occurs substantially by mechanically exerted forces. This is advantageous in that the thermal alternating loads can be sufficiently taken into account via a corresponding adjustment of the mechanical forces, for example, via clamping devices or spring-action devices, because of the mechanical tolerances connected with this mechanical fixation.

SUMMARY

An aspect of the present invention is to provide a disk cell for several semiconductor components and an assembly consisting thereof with a clamping device in which a high integration density is attained even when different semiconductor components are used, in which the number of parts and also the number of required disk cells is reduced, where structural volume is reduced, the adjustment of the clamping action is simplified and/or in which the different mechanical load limits of the components can be better reflected.

In an embodiment, the present invention provides a disk cell for pressure contacting a plurality of semiconductor components via a clamping device to generate a clamping force. The disk cell includes a housing comprising at least one metallic pressure plate, at least one first semiconductor component of a first type arranged in the housing, and at least one second semiconductor component of a second type arranged in the housing. The at least one first semiconductor component is different from the at least one second semiconductor component. The at least one metallic pressure plate is configured to reach across and to clamp the at least one first semiconductor component and the at least one second semiconductor component, to be substantially perpendicular to the clamping force, and so that the clamping force acts on the at least one metallic pressure plate to provide a local region of influence to clamp the at least one first semiconductor component and the at least one second semiconductor component. The at least one first semiconductor component is arranged below the local region of influence of the clamping force. The at least one second semiconductor component is at least partially arranged outside the local region of influence of the clamping force.

BRIEF DESCRIPTION OF THE DRAWINGS

The present invention is described in greater detail below on the basis of embodiments and of the drawings in which.

DETAILED DESCRIPTION

Figure 1:
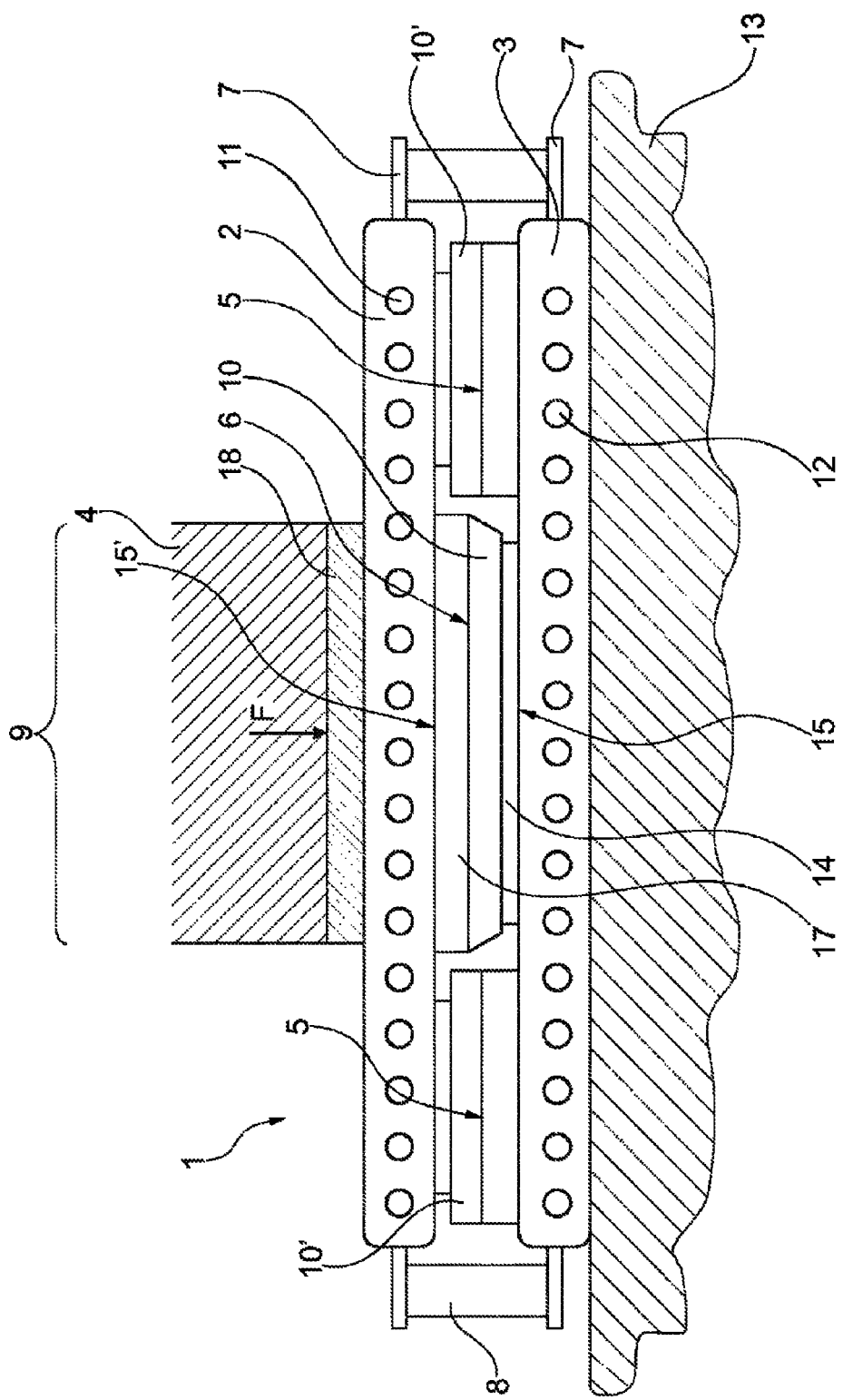
FIG. 1 shows a sectional view of a first embodiment of an assembly according to the present invention consisting of a disk cell and a clamping device.

The present invention relates to a disk cell for several semiconductor components. The disk cell according to the present invention comprises a housing. The housing can, for example, have a wall of an electrically non-conductive material, such as ceramics. The wall can, for example, be annular. The semiconductor components can, for example, be accommodated to be hermetically enclosed in the housing interior. The disk cell further comprises at least one first semiconductor component of a first type accommodated in the housing and at least one second semiconductor component of a second type accommodated in the housing. The term "disk cell" thus defines a unit which includes a housing and several semiconductor components which are hereinafter abbreviated as "components". The components can, for example, be accommodated in the housing in a loss-proof manner even if the disk cell is not clamped and/or attached to a heat sink. The terminology "different type" is to be interpreted broadly and means, for example, different external dimensions and/or geometries; it also means, for example, a difference in the layer structure with otherwise identical external dimensions, but also includes a different contact force during pressure contacting. It can, for example, be at least a difference in the mechanical load limit of the different types parallel to the direction of the clamping.

In an embodiment of the present invention, the housing comprises at least one metallic pressure plate which reaches across the first and second semiconductor components and is substantially orientated perpendicularly to the clamping force to clamp the first and second semiconductor components. In this case, the pressure plate is configured so that the clamping force acts thereon in a locally limited manner to clamp the first and second semiconductor components via the pressure plate, wherein the first semiconductor component is disposed below the local region of influence of the clamping force and the second component is at least partially, i.e., partially to completely, for example, completely, disposed outside the local region of influence.

The present invention further relates to an assembly comprising the above-described disk cell and clamping device, which are provided to clamp the first and second semiconductor components under the influence of a clamping force generated by the clamping device, and to electrically contact the first and second semiconductor components. The clamping force is, for example, generated by springs or screwing means, for example, by tension or compression screwing mechanisms.

In an embodiment of the present invention, the components of the first and second types can, for example, be clamped between a pressure plate as described above and a pressure-absorbing counterplate, wherein the counterplate abuts against a heat sink, for example, over its entire surface. In an embodiment, the components of the first and second types can, for example, be clamped between two pressure plates configured according to the present invention. The pressure plate and the counterplate can, for example, be configured, or height-adjusting disks are provided, so that, during the convergence of the counterplate and the pressure plate, which takes place prior to clamping, the touching contact with the first semiconductor component and the second semiconductor component takes place at the same time.

Stated differently, the projection of the pressure plate beyond the region of influence provides for a split of the force path. While the first semiconductor component is disposed in the force path of the clamping force, the second semiconductor component disposed underneath the projecting portion of the pressure plate is situated in the force path branched off via the pressure plate. The metallic, for example, round, pressure plate thus acts as an elastic cantilever beam and cushions the impact on the second semiconductor component or components. The contact force, and thus the mechanical stress of the second semiconductor component/components, is thus reduced compared to the first semiconductor component/components. This may be utilized, for example, to dispose the semiconductor component that has a less critical dependency of the contact resistance on the clamping force in the branched-off force path as a second semiconductor component. The second semiconductor component can, for example, be of a type whose load limit in the direction of clamping is lower than the corresponding load limit of the first semiconductor component. This is located in the region of the branched-off force path according to the present invention. For example, the different load limit of the first and second components is a result of the different thickness of the semiconductor layer, which is generally oriented perpendicularly to the clamping force. The design according to the present invention of the disk cell provides a "cushioned" stress on the second component even given a maximum clamping of the first component, a lower stress on the second component can thus be provided despite the maximum stress due to the clamping force of the first component. It is thus possible to pair components with a lower mechanical load-bearing capacity with components with a higher load-bearing capacity in a single disk cell. In particular, given a corresponding arrangement, i.e., if the second component is the component with the same or a lower mechanical load-bearing capacity, it is safely possible to clamp the first component without the danger of mechanically destroying the second component. A destruction of the second semiconductor component can thus be reliably prevented even at a maximum load on the first component, which is intended for reasons of thermal and electrical contacting.

In an embodiment of the present invention, the pressure plate can, for example, abut against the corresponding contacting surfaces of the semiconductor components and thus simultaneously serve to directly contact the electrical and thermal contacting of the semiconductor components.

In an embodiment of the present invention, it is provided that the first semiconductor component, at least with one of its abutting surfaces, does not, for example, abut over its entire surface, at least in the non-clamped state. In other words, the semiconductor component forms a cavity with its abutting counterpart, for example, the pressure plate according to the present invention or the pressure-absorbing counterplate. This accords the possibility that the first semiconductor component undergoes a change of shape under the influence of the clamping action and that the abutting contact of the semiconductor component increases due to elastic or plastic deformation as the clamping force increases. The semiconductor component thus "cushions" the clamping action. The clamping action of the semiconductor component can therefore be better adjusted due to the counterforce of the first semiconductor component. This can, for example, be solved by a curved abutting surface on the side of the semiconductor component. An outer layer, which comprises a semiconductor material, for example, silicon, of the first semiconductor component has a surface that is curved away from the abutting surface.

In an embodiment of the present invention, the first semiconductor component, i.e., the entire layer structure, can, for example, be configured in a curved manner in the non-clamped state.

In an embodiment of the present invention, the maximum clear distance between the abutting surface and the associated countersurface in the non-clamped state can, for example, be a range from 5 µm to 150 µm, for example, from 10 µm to 100 µm. The term "clear distance" means the maximum possible difference in height between full-surface abutting contact and unloaded abutting contact.

In an embodiment of the present invention, the outer circumference of the first semiconductor component can, for example, be located outside the region of influence of the clamping force or is congruent with the outer circumference of the region of influence. In combination with a first semiconductor component which abuts only on the outer circumference and which is raised in the inner region of the abutting surface in the non-clamped state, a high level of pliability of the first semiconductor component is thus obtained in the case of dish-shaped semiconductor components.

In an embodiment of the disk cell according to the present invention, exactly one first semiconductor component is provided, whereas several second semiconductor components are provided, and the second semiconductor components can, for example, be disposed to be distributed around the first semiconductor component at matching distances or at different distances, wherein one respectively different distance is included. The integration density can be increased with this embodiment without having to sacrifice the advantages mentioned in the introduction, such as the mechanical-load grading in the radial direction. The local region of influence of the pressure plate can, for example, include its geometrical center point.

In an embodiment of the present invention, the first semiconductor component can, for example, be configured as a circular flat structure, and several second semiconductor components can, for example, be provided which are disposed uniformly distributed along one or more concentric circles around the radial circumference of the first semiconductor component.

In an embodiment of the present invention, fluid-conducting channels can, for example, be integrated into the pressure plate in order to allow a cooling medium flow through the pressure plate for active cooling.

The first semiconductor component can, for example, be configured as a round flat structure. The first semiconductor component can, for example, have a diameter in the range from 10 to 100 mm, for example, in the range of 20 to 80 mm, for example, in the range of 50 to 70 mm, such as 60 mm. The second semiconductor components, which are provided in one embodiment and are disposed around the first semiconductor component, are disposed, for example, in a ring around the first semiconductor component whose internal/external diameter is in the range of 10/20 to 100/200 mm, for example, in the range of 20/40 to 80/160 mm, for example, in the range of 50/100 to 70/140 mm, such as 60/120 mm.

In an embodiment of the present invention, the maximum surfaces provided for electrical contacting, which are also referred to as active surfaces, can, for example, be at a certain ratio with each other. In order to achieve a high surface coverage density, among other things, the ratio of the active surface of the first component to that of the second component can be in a range of 1:1 to 1:4, for example, in the range of 1:1.5 to 1:2.5, for example, 1:2. For a particularly high surface coverage density, and thus integration density, of the disk cell according to the present invention, the at least one second semiconductor component is configured as a rectangular, for example, a square or trapezoidal, flat structure.

In an embodiment of the present invention, the first semiconductor component can, for example, be a monolithic semiconductor component, such as a diode or thyristor.

In an embodiment of the present invention, the at least one second semiconductor component can, for example, be an insulated gate bipolar transistor (IGBT).

In an embodiment of the present invention, the semiconductor components of the first and second types can, for example, be disposed at a distance from each other in the direction perpendicular to the clamping force, for example, at a distance of 2 mm to 10 mm.

The present invention further relates to an assembly of a heat sink and a disk cell in one of the previously described embodiments and with the corresponding technical advantages mentioned above.

The present invention is explained further below with reference to the drawings. The drawings are to be understood only as examples.

FIG. 1 shows, in a section and schematically, a first assembly according to the present invention consisting of a disk cell 1 and clamping device 4, 13. The disk cell 1 has a hermetically sealed housing 2, 3, 7, 8. The housing 2, 3, 7, 8 comprises an electrically insulating ring 8 made of ceramics which is provided with a metallic coating on its end faces. The electrically insulating ring 8 is soldered on each of both end faces to an annular disc 7 of copper via the coating. The annular discs 7 each end in a hermetically tight seal with a pressure plate 2 or a pressure-absorbing counterplate 3. Exactly one round, disk-shaped, first semiconductor component 6 of the first type and several second semiconductor components 5 of the second type, in this case IGBTs, are clamped between the pressure plate 2 and the pressure-absorbing counterplate 3, wherein the second semiconductor components 5 are disposed uniformly distributed around the outer circumference of the first semiconductor component 6. The semiconductor components 5, 6 have semiconductor layers 10, 10' that respectively extend perpendicularly to the clamping direction. Metallic layers 14, 17 for the electrical contacting of the semiconductor components 5, 6 are also provided at each of the sides of the semiconductor components 5, 6 that are in touching contact with the pressure plate 2 and the counterplate 3. The electrical contacting and a required heat dissipation are carried out via the pressure plate 2 and the counterplate 3. The pressure plate 2 and the counterplate 3 are crossed by one or more fluid-conducting channels 11, 12 for heat dissipation. The channels 11 of the pressure plate 2 and the channels 12 of the counterplate 3 are disposed in an imaginary plane orientated perpendicularly to the clamping direction. In the assembly shown in FIG. 1, the counterplate 3 abuts over its entire surface against a heat sink 13. The clamping device comprise a pressure piston 4, 18, via which a clamping force F, which is generated, for example, by a compression screw, acts on the round pressure plate 2. The area of influence 9 is defined by a plateau-shaped raised portion 18 of the pressure plate 2. The raised portion 18 can be configured integrally with the pressure plate 2 or as a separate part of the pressure plate 2. While the first semiconductor component 6 is disposed directly below the area of influence 9, the second semiconductor components 5 are disposed below the outer part of the pressure plate 2 projecting beyond the region of influence. Due to the elastic pliability of the pressure plate 2 in the branched-off force path through the second semiconductor components 5, the mechanical load on them is reduced compared with that of the first semiconductor component 6. If, for example, the first semiconductor component 6 and second semiconductor components 5 do not have the same mechanical maximum load limits, a mechanical destruction of the second semiconductor components 5 can be prevented by the inventive configuration of the pressure plate 2 until the maximum load on the first semiconductor component 6, which is intended for reasons of electrical and thermal contacting, is reached.

Figure 2:
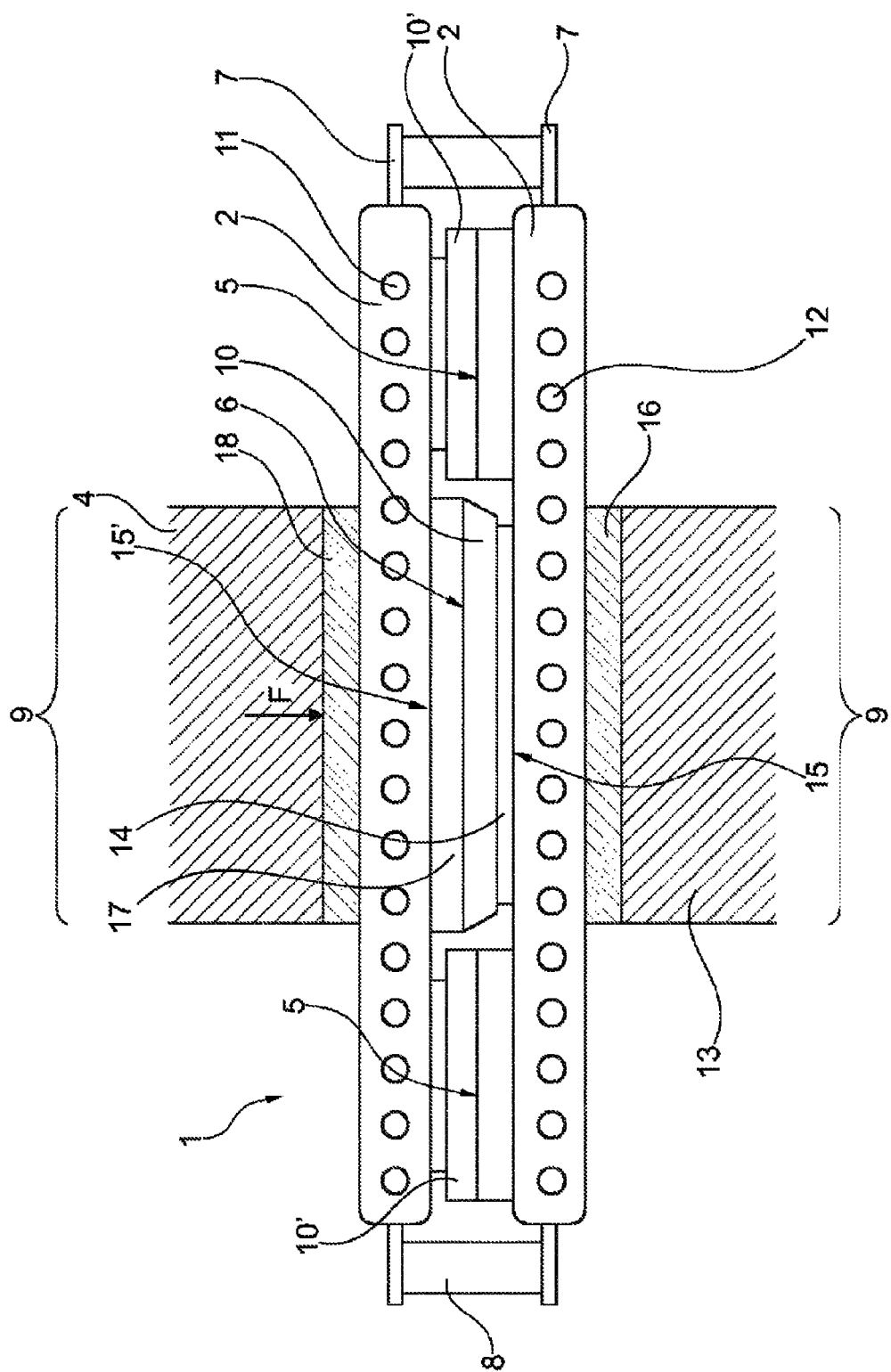
FIG. 2 shows a sectional view of a second embodiment of an assembly according to the present invention consisting of a disk cell and a clamping device.

FIG. 2 shows a second embodiment of the assembly according to the present invention which differs from the assembly shown in FIG. 1 by the configuration of the clamping device 4, 13, and by the fact that not only exactly one pressure plate 2 is provided, but two pressure plates 2 with plateau-shaped raised portions 16, 18, respectively. The above-described advantageous effect is thus provided on both sides of the semiconductor components 5, 6.

Figure 3:
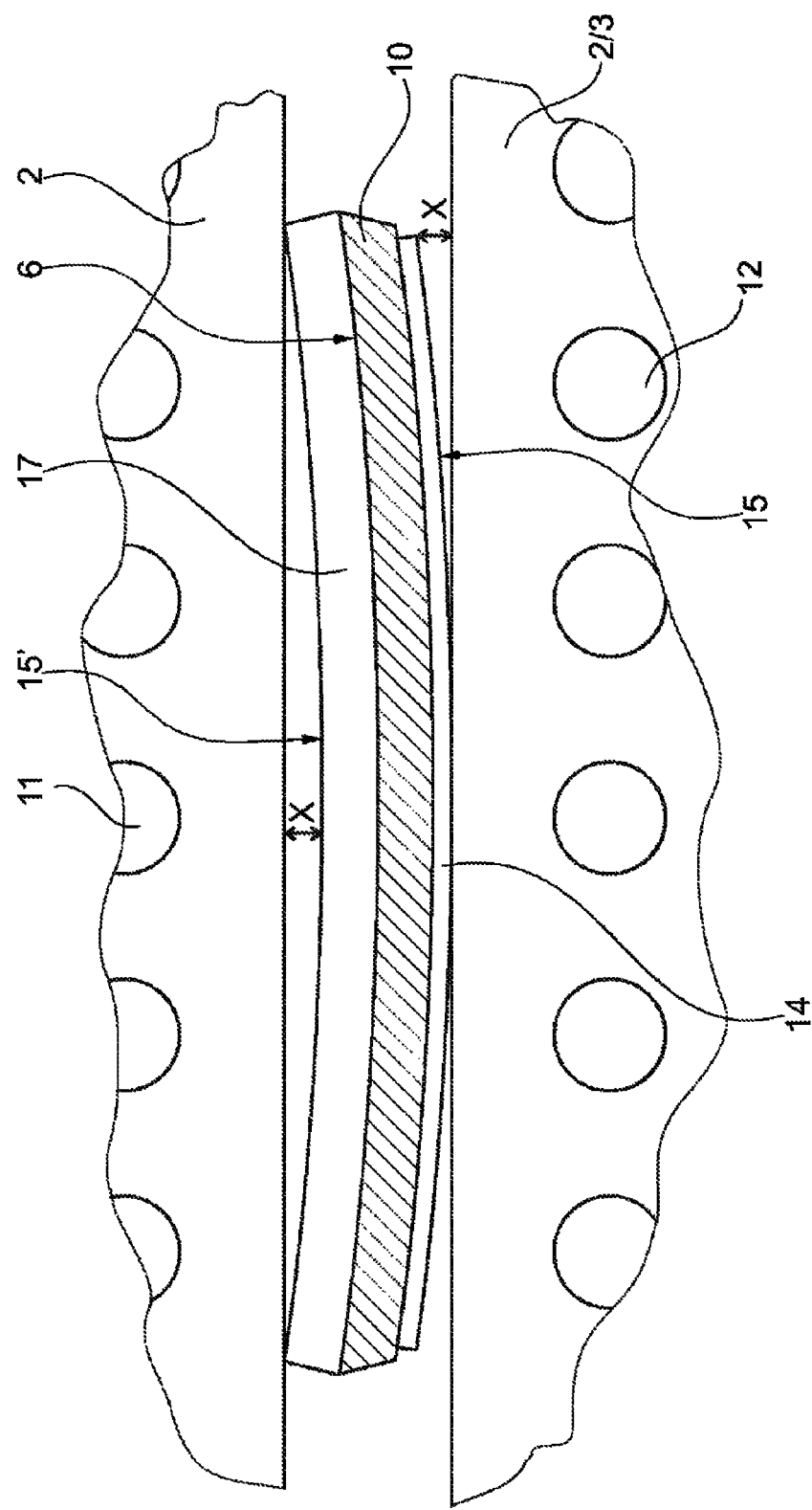
FIG. 3 shows a detailed view associated with the FIGS. 1 and 2.

FIG. 3 shows a detailed view concerning both FIG. 1 and FIG. 2. FIG. 3 shows the layer structure of the first semiconductor component 6 located between the pressure plates 2, or between the pressure plate 2 and the counterplate 3, in the non-clamped state merely in touching contact with the pressure plates 2 or the counterplate 3. The entire layer structure of the first semiconductor component 6 is curved; the depicted curvature is not shown to scale. The layer structure, which is curved away from the semiconductor layer 10 and towards the molybdenum layer 17, provides for a "bulge/raised structure" of the first semiconductor component 6 by the extent X on both sides of the first semiconductor component 6 in the region of the abutting surfaces 15 and 15'. As the clamping action increases, the layer structure of the first semiconductor component 6 is bent in the opposite direction to this pre-curvature. The, for example, elastic bending moment, which is caused by the pre-curvature, counteracts the clamping action and simplifies the adjustment and scaling of the clamping force F to the maximum load limit of the first semiconductor component 6. The danger of the mechanical destruction of the second semiconductor component 5 during clamping is thus minimized.

The present invention is not limited to embodiments described herein; reference should be had to the appended claims.

What is claimed is:

1. A disk cell for pressure contacting a plurality of semiconductor components via a clamping device to generate a clamping force, the disk cell comprising:
    a housing comprising at least one metallic pressure plate;
    at least one first semiconductor component of a first type arranged in the housing; and
    at least one second semiconductor component of a second type arranged in the housing, the at least one first semiconductor component being different from the at least one second semiconductor component,
    wherein,
    the at least one metallic pressure plate comprises a first part arranged directly axially beneath the clamping force and a second part which is not arranged directly axially beneath the clamping force, the at least one metallic pressure plate being configured,
        to reach across and to clamp the at least one first semiconductor component and the at least one second semiconductor component,
        to be substantially perpendicular to the clamping force, and
        so that the clamping force acts axially downwards on the at least one metallic pressure plate to provide a first local region of influence directly axially below the first part and a second local region of influence directly axially below the second part, a projection of pressure via the clamping force on the first local region of influence being greater than the projection of pressure via the clamping force on the second local region of influence,
    the at least one first semiconductor component is arranged at least in part within the first local region of influence, and
    the at least one second semiconductor component is arranged completely within the second local region of influence.

2. The disk cell as recited in claim 1, wherein,
    the at least one first semiconductor component comprises a plurality of abutting surfaces,
    at least one metallic pressure plate comprises a countersurface which is associated with at least one of the plurality of abutting surfaces, and
    at least one of the plurality of abutting surfaces of the at least one first semiconductor component does not abut over its entire surface against the associated countersurface of the at least one pressure plate at least in a non-clamped state.

3. The disk cell as recited in claim 2, wherein the at least one first semiconductor component is configured in a curved manner in the non-clamped state.

4. The disk cell as recited in claim 2, wherein a maximum clear distance between the at least one plurality of abutting surfaces and the associated countersurface in the non-clamped state is in a range of from 5 µm to 150 µm.

5. The disk cell as recited in claim 2, wherein,
    the at least one first semiconductor component further comprises a layer of semiconductor material, and
    the at least one plurality of abutting surfaces associated with the countersurface is defined by the layer of semiconductor material.

6. The disk cell as recited in claim 1, wherein,
    the at least one metallic pressure plate comprises a raised portion on a side thereof facing away from the least one first semiconductor component and the at least one second semiconductor component, and
    the first local region of influence of the clamping force on the at least one pressure plate is defined by the raised portion.

7. The disk cell as recited in claim 1, wherein,
    the least one first semiconductor component comprises a circumference, and
    the circumference of the first semiconductor component is located outside the first local region of influence of the clamping force or is congruent therewith.

8. The disk cell as recited in claim 1, wherein the at least one pressure plate is configured to be round.

9. The disk cell as recited in claim 1, wherein at least the first semiconductor component is arranged directly adjacent to the at least one pressure plate.

10. The disk cell as recited in claim 1, further comprising at least one channel configured to have a cooling fluid flow therethrough, the at least one channel being integrated into the at least one pressure plate.

11. The disk cell as recited in claim 1, wherein:
    the at least one first semiconductor component consists of exactly one first semiconductor component, and
    the at least one second semiconductor component consists of at least two second semiconductor components,
    wherein, the at least two second semiconductor components are arranged so as to be distributed at a same distance or at different distances around the exactly one first semiconductor component.

12. The disk cell as recited in claim 11, wherein,
the exactly one first semiconductor component is configured as a circular flat structure, and
the at least two second semiconductor components are uniformly distributed along one or more concentric circles around a radial circumference of the exactly one first semiconductor component.

13. The disk cell as recited in claim 1, wherein the at least one second semiconductor component is configured as a rectangular flat structure.

14. The disk cell as recited in claim 1, wherein the at least one first semiconductor component is a monolithic semiconductor component.

15. The disk cell as recited in claim 14, wherein the at least one first semiconductor component is a diode or a thyristor.

16. The disk cell as recited in claim 1, wherein the at least one second semiconductor component is an insulated gate bipolar transistor.

17. The disk cell as recited in claim 1, wherein:
the at least one metallic pressure plate consists of a first metallic pressure plate and a second metallic pressure plate,
wherein, the at least one first semiconductor component and the at least one second semiconductor component are clamped between the first metallic pressure plate and the second metallic pressure plate.

18. An assembly comprising:
a clamping device; and
a disk cell as recited in claim 1.

* * * * *